United States Patent
Wang et al.

(10) Patent No.: US 12,080,589 B2
(45) Date of Patent: Sep. 3, 2024

(54) FORMATION METHOD OF SEMICONDUCTOR STRUCTURE

(71) Applicant: SHANGHAI IC R&D CENTER CO., LTD., Shanghai (CN)

(72) Inventors: Weijun Wang, Shanghai (CN); Hong Lin, Shanghai (CN)

(73) Assignee: SHANGHAI IC R&D CENTER CO., LTD., Shanghai (CN)

( * ) Notice: Subject to any disclaimer, the term of this patent is extended or adjusted under 35 U.S.C. 154(b) by 595 days.

(21) Appl. No.: 17/284,849

(22) PCT Filed: Sep. 6, 2019

(86) PCT No.: PCT/CN2019/104666
§ 371 (c)(1),
(2) Date: Apr. 13, 2021

(87) PCT Pub. No.: WO2020/048524
PCT Pub. Date: Mar. 12, 2020

(65) Prior Publication Data
US 2022/0059402 A1    Feb. 24, 2022

(30) Foreign Application Priority Data
Sep. 7, 2018  (CN) .......................... 201811044219.6

(51) Int. Cl.
*H01L 21/762*    (2006.01)
*H01L 21/02*    (2006.01)
(Continued)

(52) U.S. Cl.
CPC .. *H01L 21/76224* (2013.01); *H01L 21/02323* (2013.01); *H01L 21/3065* (2013.01);
(Continued)

(58) Field of Classification Search
None
See application file for complete search history.

(56) References Cited

U.S. PATENT DOCUMENTS

8,765,556 B2 * 7/2014 Hsu ...................... H01L 21/3083
                                                                    438/300
8,951,884 B1 * 2/2015 Shih ................ H01L 21/823431
                                                                    438/424
(Continued)

*Primary Examiner* — Hsien Ming Lee
(74) *Attorney, Agent, or Firm* — Andrew C. Cheng (57) ABSTRACT

The present invention discloses a formation method, comprising: forming a hard mask layer and a photo-lithographic pattern of a fin structure on a the semiconductor substrate; patterning the hard mask layer and the semiconductor substrate to gain the fin structure with a profile of steep sidewalls; forming a protective layer on the sidewall surface of the fin structure; etching the semiconductor substrate located below the fin structure to form isolation structure trenches; performing a modified treatment on the exposed surfaces of the isolation structure trenches to form a modified layer with a certain thickness; removing the protective layer and the modified layer simultaneously; filling a dielectric layer in the isolation structure trenches till to cover the fin structure and then planarizing the dielectric layer; performing a trench etching to the dielectric layer and forming the fin structure and an isolation structure with sloped sidewalls.

10 Claims, 3 Drawing Sheets

(51) Int. Cl.
 *H01L 21/3065* (2006.01)
 *H01L 21/308* (2006.01)
 *H01L 21/3105* (2006.01)
 *H01L 21/311* (2006.01)

(52) U.S. Cl.
 CPC .... *H01L 21/3081* (2013.01); *H01L 21/31053* (2013.01); *H01L 21/31111* (2013.01); *H01L 21/31116* (2013.01)

(56) References Cited

U.S. PATENT DOCUMENTS

| | | | |
|---|---|---|---|
| 2013/0056826 A1* | 3/2013 | Liu | H01L 27/0886 |
| | | | 257/E21.409 |
| 2016/0358911 A1* | 12/2016 | Chen | H01L 29/42376 |
| 2018/0337046 A1* | 11/2018 | Shamma | H01L 21/0338 |
| 2019/0067000 A1* | 2/2019 | Shen | H01L 21/0273 |
| 2019/0386135 A1* | 12/2019 | Li | H01L 29/66666 |
| 2020/0043810 A1* | 2/2020 | Ching | H01L 21/823431 |

* cited by examiner

FORMATION METHOD OF SEMICONDUCTOR STRUCTURE

CROSS-REFERENCE TO RELATED APPLICATION

This application claims priority of International Patent Application Serial No. PCT/CN2019/104666, filed Sep. 6, 2019, which is related to and claims priority of Chinese patent application Serial No. 201811044219.6 filed on Sep. 7, 2018. The entirety of each of the above-mentioned patent applications is hereby incorporated herein by reference and made a part of this specification.

TECHNICAL FIELD

The disclosure relates to the technical field of semiconductor integrated circuit manufacturing processes, in particular to a formation method of a semiconductor structure having a fin structure and an isolation structure.

BACKGROUND

After semiconductor processes developed to a 22 nm technology node, CMOS manufacturing processes began to transit from a planar transistor structure to a three-dimensional FinFET device structure. Compared with the planar transistor structure, the FinFET device structure improves channel control and reduces short-channel effect. In addition, a gate of a planar transistor is above a channel, and a gate of a FinFET usually surrounds a channel from three sides, which enables electrostatical control on the channel from both sides. Changes in device structures mentioned above have brought great challenges to CMOS manufacturing processes. At the 22 nm process node, an aspect ratio of a fin structure is usually greater than 3, such high fin structure makes etching of the fin structure, a trench of the isolation structure, and profile control become more difficult.

Mainstream FinFET processes flow can be divided into a SOI substrate process flow or a bulk silicon substrate process flow according to substrate type. Since a buried oxide layer of the SOI substrate can determine the height of the fin structure and achieve electrical isolation between the fins, the process flow is relatively simple. However, due to considerations of device cost and other factors, the process flow based on bulk silicon substrates has also been received increasing attention. For bulk silicon substrate process development, since no intrinsic isolation layer exists, a clear interface doesn't exist at the bottom of the fin structure, thus, it is more difficult to control consistency of height and width.

In addition, profile control of the fin structure is also one of the technical difficulties. Data simulation results show that the fin structure remains close to a vertical state, which helps to improve and optimize relevant electrical performances of a device (such as significantly increase a switching current ratio). In contrast, an isolation structure usually requires a certain slope in sidewalls of an active area, which helps to fill a dielectric material and facilitates ion implantation at the bottom of the fin structure to achieve device isolation. In a conventional process flow, the fin structure and the active area are formed by a single patterning process step, which generally makes the overall profile and the slope of the sidewalls consistently, and it is difficult to form an ideal profile of the fin structure and the active area respectively.

Based on the above issues, a process flow is adjusted, and corresponding process steps are added to form a fin structure and an isolation structure respectively.

A Chinese invention patent application with a publication number of CN1581431A, "Multi-Structured Silicon Fins and Manufacturing Method" discloses a fin structure with different profiles between top and bottom regions. However, the application has following problems:
(1) a sidewall spacer is formed to protect a formed first pattern (fin), such process step can form a horizontal stepped portion on the first pattern at the lower part of the sidewall spacer, thus causing undesired influence to fin shape;
(2) a conventional dry etching process is used in the first and second etching, which is difficult to accurately control the uniformity and the load effect between fin structures.

The method of the above application still has considerable difficulties in realizing an ideal profile of a fin structure and an active area in a practical process.

Therefore, for process development of the fin structure, a new process method is needed to be developed with proper operability, process uniformity and stability.

SUMMARY

The technical problem to be solved by the present invention is to provide formation method of a semiconductor structure having a fin structure and an isolation structure.

In order to achieve the above object, the present invention provides a formation method of a semiconductor structure, comprising:
providing a semiconductor substrate, and forming a hard mask layer on the semiconductor substrate;
forming a photo-lithographic pattern of a fin structure on the hard mask layer;
using the photo-lithographic pattern as a mask and patterning the hard mask layer and the semiconductor substrate below the hard mask layer to obtain a hard mask pattern and the semiconductor substrate with the fin structure; and the sidewall profile of the fin structure is steep;
forming a protective layer on sidewall surfaces of the fin structure;
using the fin structure as a mask to etch the semiconductor substrate located below to form isolation structure trenches;
performing a modified treatment on exposed surfaces of the isolation structure trenches to form a modified layer with a certain thickness;
removing the protective layer and the modified layer simultaneously;
filling a dielectric layer in the isolation structure trenches till to cover the fin structure;
planarizing the dielectric layer till to expose the hard mask layer on the top of the fin structure;
performing a trench etching process to the dielectric layer and forming the fin structure and an isolation structure with sloped sidewalls.

Further, the modification treatment is a thermal oxidation process, a thickness of the semiconductor substrate consumed by the thermal oxidation process corresponds to a thickness of the protective layer, and the protective layer and the modified layer are removed simultaneously by a wet etching process.

Further, the hard mask layer and the semiconductor substrate are patterned by an atomic layer etching process;

wherein, during the atomic layer etching process, an etching amount per cycle is 0.5 nm to 5 nm, so as to accurately control the linewidth and the height of the fin structure.

Further, the protective layer comprises $SiO_2$ or SiN, or a combined layer of $SiO_2$ and SiN.

Further, the protective layer is formed on the surfaces of the sidewalls of the fin structure by a conformal deposition process.

Further, the conformal deposition process comprises ALD, PEALD or thermal oxidation deposition.

Further, the hard mask layer comprises one of SiN, SiON, SiC and $SiO_2$, or a combined layer of at least two of SiN, SiON, SiC and $SiO_2$.

Further, the protective layer is $SiO_2$ and the semiconductor substrate is Si, the isolation structure trenches are formed by a dry etching process using etching gases comprising HBr, He and $O_2$, and flow rates of the etching gases are: HBr 180~ 220 sccm, He 350~ 450 sccm, O2 4~ 6 sccm; etching pressure is 70~ 90 mtorr; a source power range is 800 1200 W, so as to increase the etching selectivity ratio of Si and $SiO_2$.

Further, the protective layer is SiN and the semiconductor substrate is Si, the isolation structure trenches are formed by a wet etching process or a dry releasing process. Due to a specific crystal orientation of the Si substrate, an anisotropic etching of the Si substrate can be achieved, and the isolation structure with specific slope sidewalls can be formed.

Further, during performing the trench etching process to the dielectric layer, the hard mask layer is used as a protective mask to etch the dielectric layer surrounding the fin structure, and by utilizing the profile differences between the fin structure with steep sidewalls and the isolation structure with sloped sidewalls, the etching depth can be controlled by an endpoint detection method.

Beneficial effects of the present invention are that, by regulating the process flow to form a fin structure and an isolation structure in steps, the physical profiles of the sidewalls of both the fin structure and the isolation structure can be adjusted independently, and by utilizing advanced process control to improve process accuracy, uniformity and stability, it can solve some existing technical difficulties. The uniformity and consistency of the physical profiles of the fin structure and the isolation structure can be controlled more accurately, so as to improve the electrical performance and device reliability of FET devices.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the disclosure as recited in the appended claims.

It is to be understood that "first", "second" and similar terms used in the specification and claims are not to represent any sequence, number or importance but only to distinguish different parts. Likewise, similar terms such as "a" or "an" also do not represent a number limit but represent "at least one". It is also to be understood that term "and/or" used in the present disclosure refers to and includes one or any or all possible combinations of multiple associated items that are listed.

The key idea of a formation method of a semiconductor structure provided by the present invention is to use advanced process control to form a fin structure and an isolation structure in steps, and thereby independently adjusting the physical profiles of the two structures to improve the process accuracy, uniformity and stability, so as to increase the related electrical performances of a FET device (such as switching current ratio $I_{on}/I_{off}$).

The formation method of the semiconductor structure having a fin structure and an isolation structure is provided by the present invention, which is mainly applicable to a formation process of physical structures of source/drain regions and a channel region using a semiconductor technology below 20 nm, and is also applicable as a reference for a formation method of other fin-like physical structures.

Content of the present invention will be further described in detail below with a reference to the accompanying drawings of the description. It should be understood that the present invention can have various changes in different examples, all without departing from the scope of the present invention, and the descriptions and diagrams therein are essentially for the purpose of illustration, rather than limiting the present invention. It should be noted that the drawings are in a very simplified form and all use inaccurate ratios, which are only used to facilitate and clearly explain the purpose of the embodiments of the present invention.

The following specific embodiments take a formation method of a fin structure (fin) of a FinFET on a bulk silicon substrate with a 20 nm technology as an example.

In order to obtain better device electrical performances and in consideration of process convenience (such as larger switching current ratio $I_{on}/I_{off}$, good electrical isolations between devices), profiles of fins and an isolation structure located below are required, which requires the source/drain regions and the channel region (fin structure) to be relatively steep, and an isolation structure to be sloped for convenient dielectric filling.

Numerical simulation results show that the shape of the fin structure has a significant effect on the switching current ratio of a FinFET. $I_{on}/I_{off}$ increases monotonically with increasing of a bottom tilt angle q, and reaches a maximum value while the sidewall profile of the fin structure is steep (q=90°). Meanwhile, for deep sub-micron and nano-level devices, accuracy and uniformity of process control is also very important, which has a direct impact on product yield.

Figure 1:
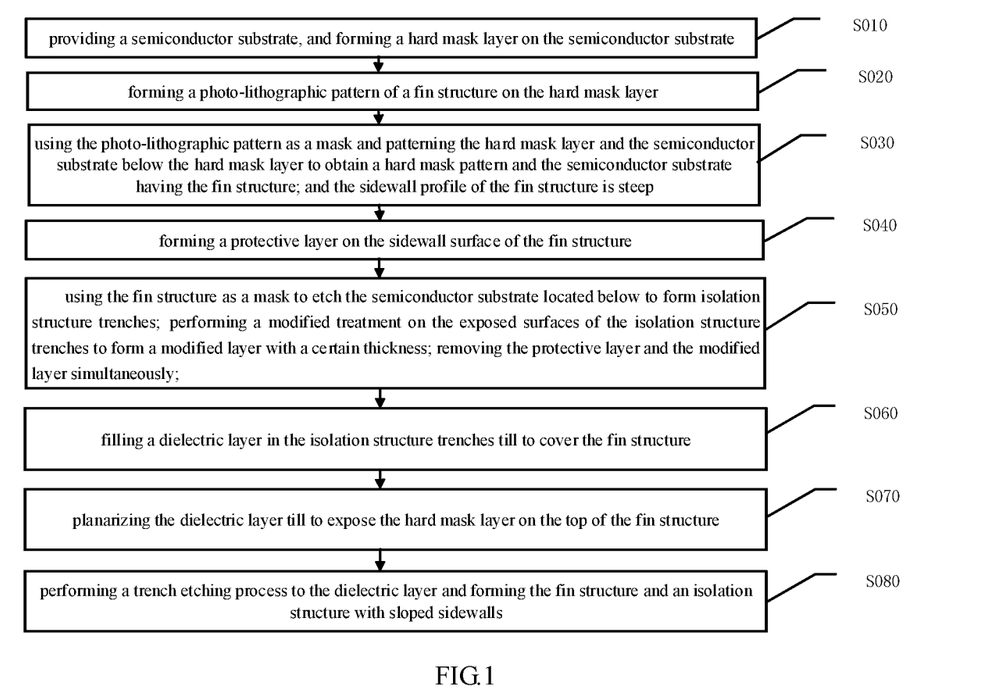
FIG. 1 is a flow chart for a formation method of a semiconductor structure having a fin structure and an isolation structure according to a preferred embodiment of the present invention.
Figure 2:
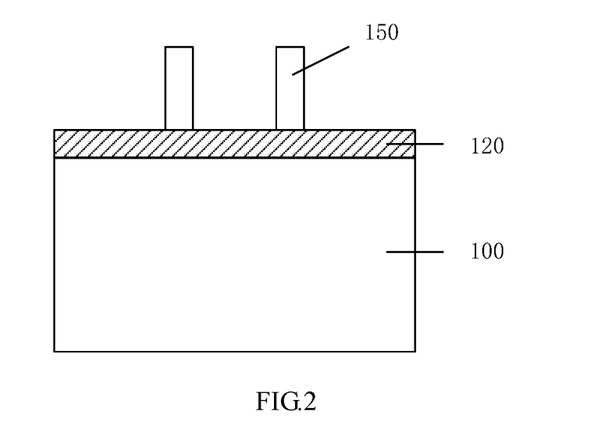
FIG. 2 is schematic structural diagrams of the semiconductor structure after respective process step 010 and step 020 of the formation method of FIG. 1.

Please refer to FIG. 1 and FIG. 2 to FIG. 8. A formation method of a semiconductor structure comprises following steps:

Step S010: providing a semiconductor substrate and forming a hard mask layer on the semiconductor substrate.

Please refer to FIG. 2. A semiconductor substrate 100 can be a silicon substrate or a substrate formed of other suitable semiconductor materials. According to design requirements, the semiconductor substrate 100 can be a P-type substrate or an N-type substrate, which has a doped region therein. For this embodiment, the material of the semiconductor substrate is uniform, and no intrinsic isolation layer exists. Herein, a bulk silicon substrate is preferred.

The hard mask layer 120 comprises one of SiN, SiON, SiC and $SiO_2$, or a combination of the above-mentioned, and can be formed by plasma enhanced chemical vapor deposition (PECVD), atomic layer deposition (ALD), plasma enhanced ALD (PEALD), thermal oxidation or other suitable deposition processes.

In this embodiment, preferably, the hard mask layer 120 is SiON and formed by PECVD. The thickness of the hard mask layer 120 can be 5 nm to 15 nm, and preferably 10 nm.

Step S020: forming a photo-lithographic pattern of a fin structure on the hard mask layer.

Please continue to refer to FIG. 2. The photo-lithographic pattern used to form the fin structure can be a photoresist (PR) pattern formed by an electron beam lithography, or a photo-lithographic pattern formed by a sacrificial layer spacer (that is SADP, short for Self-aligned Double Patterning). Since the SADP is a relatively mature process, it is not detailed here.

In this embodiment, the photo-lithographic pattern 150 is a photoresist, and the thickness of the photoresist is 80 nm to 150 nm, preferably 100 nm.

The linewidth of the fin structure pattern to be formed is 5 nm to 60 nm, preferably 8 nm; the fin space is 8 nm to 60 nm, preferably 10 nm. The photo-lithographic pattern 150 has a size and a pitch corresponding thereto.

Multiple fins are formed during a formation method of a FinFET to obtain larger channel width and thus a larger current. Generally, the number of the fins is 4 to 10. FIG. 2 is a simplified diagram to illustrate the key idea of the present invention, which shows the photo-lithographic pattern 150 of only two fins.

Figure 3:
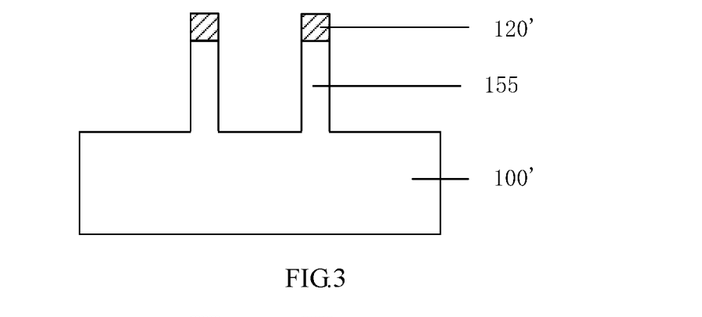
FIG. 3 is schematic structural diagrams of the semiconductor structure after respective process step 030 of the formation method of FIG. 1.

Step S030: using the photo-lithographic pattern as a mask and patterning the hard mask layer and the semiconductor substrate below to obtain a hard mask pattern and the semiconductor substrate having a fin structure; the sidewall profile of the fin structure is steep.

Please refer to FIG. 3. The photo-lithographic pattern 150 of the fins is used to etch the hard mask layer 120 and the semiconductor substrate 100 to achieve patterning, and a hard mask pattern 120' and a substrate 100' having a fin structure 155 are obtained.

The aspect ratio (AR: aspect ratio) of the Fin structure is usually 3 to 6. In this embodiment, AR=4 is taken as an example. The etching depth of the semiconductor substrate 100 is 30 nm to 35 nm, and preferably 32 nm.

Layers involved in the etching process in order are the hard mask layer SiON which is 10 nm, and the Si layer which is 32 nm.

Since various morphological parameters (such as linewidth, height, and sidewall inclination) and consistency of the fin structures have a significant impact on device performances and forming highly uniform fins can effectively improve the device performances, precise control is required for this etching process. Therefore, a novel technology of atomic layer etching (ALE) is used, which can improve the etching accuracy to the extent of a single atomic layer level by accurately controlling gas flows of reactive gases and pulsed input power. Although it has the disadvantage of low etching rate, the yield is still acceptable for a fin structure due to the small etching depth of 40 nm to 50 nm.

The single cycle of the ALE can be divided into 3 steps:
① inputting an etching gas;
② inputting a removal gas;
③ Cleaning.

Corresponding process parameters can be:
① in the step of inputting the etching gas, the flow rate of $Cl_2$ is 50 sccm to 100 sccm, preferably 80 sccm; the chamber pressure is 5 mtorr to 50 mtorr, preferably 15 mtorr; the power is set as 0.
② in the step of inputting the removal gas, the removal gas comprises one of Ar, $N_2$ and He, or a combination thereof. In this embodiment, Ar is preferred. The flow rate of Ar is 300 sccm to 400 sccm, preferably 350 sccm. The chamber pressure is 100 mtorr to 300 mtorr, preferably 250 mtorr; the source power is 100 W to 1500 W, preferably 800 W, and a bias power is 0W to 500 W, preferably 300 W.
③ in the step of cleaning, the flow rate of $O_2$ is 500 sccm to 1000 sccm, preferably 800 sccm, and the chamber pressure is 200 mtorr to 500 mtorr, preferably 300 mtorr; the power is set as 0.

Si can be etched by 0.5 nm to 5 nm per single cycle under a process condition with the process parameters mentioned above. In this embodiment, by controlling the flow rates of process gasses, the chamber pressure and by adjusting the time of each step, etching thickness per single cycle is about 1 nm. The ALE can precisely control the linewidth and the height of each fin of the fin structure, so that differences in linewidth and height (etching depth) between the fins are less than 1 nm, and a fairly steep sidewall profile is obtained through anisotropic etching, the fin structure maintains good morphological consistency, and the effect of the high aspect ratio of the fin structure to the etching is also eliminated.

After the ALE is completed, conventional processes of removing the photo-lithographic pattern and wet cleaning can be performed.

Figure 4:
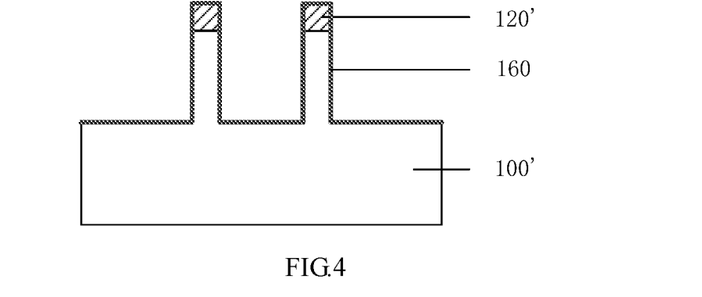
FIG. 4 is schematic structural diagrams of the semiconductor structure after respective process step 040 of the formation method of FIG. 1.

Step S040: forming a protective layer on sidewall surfaces of the fin structure.

Please refer to FIG. 4. In order to maintain the steep sidewall profile of the fin structure 155 in subsequent processes, a protective layer 160 needs to be formed on the sidewalls of the fins.

The protective layer 160 comprises one of $SiO_2$ and SiN, or a combination of $SiO_2$ and SiN, and the protective layer 160 is formed by a suitable deposition process such as ALD, PEALD or thermal oxidation.

The protective layer 160 is formed by a conformal deposition process, and the thickness of the protective layer 160 is thin and requires to be precisely controlled to ensure uniformity.

In this embodiment, the protective layer 160 is $SiO_2$ and is formed by ALD; the film thickness is 1 nm to 3 nm, and preferably 1.5 nm. The protective layer 160 covers the top surface (that is, the upper surface of the hard mask pattern 120') and the sidewall surfaces (including sidewall surfaces of the hard mask pattern 120') of the fin structure 155 and the surface of the semiconductor substrate 100 between the fin structures 155.

This step S040 forms the protection layer on the sidewalls of the fins by ALD, so that the film thickness of the protective layer 160 can be very thin, for example, less than 5 nm, without forming a sidewall spacer structure in the prior art. Therefore, a problem of obvious horizontal steps can be avoided in the structure formed subsequently, and the profile of the fin structure can be controlled more accurately.

Figure 5:
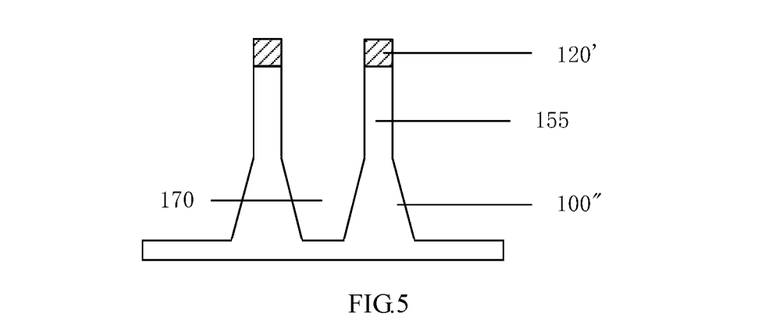
FIG. 5 is schematic structural diagrams of the semiconductor structure after respective process step 050 of the formation method of FIG. 1.

Step S050: using the fin structure as a mask to etch the semiconductor substrate located below to form isolation structure trenches.

Please refer to FIG. 5. This step is used to form a structure of an isolation portion by etching. The structure needs to maintain slope sidewalls in order to facilitate subsequent processes of dielectric filling and ion implantation, and the slope of the sidewalls is 82° to 86°.

The fin structure formed can be used as the mask to etch the semiconductor substrate located below to form the isolation structure trenches 170, so as to obtain a substrate 100" with the fin structure 155 and the isolation structure trenches 170.

The depth of an isolation structure is highly related to the height of the fins, which is preferably 50 nm in this embodiment. By adjusting and optimizing the etching parameters, the etching selection ratio of $Si/SiO_2$ can reach or approach to 100, so that the protection layer 160 can protect the formed fin structure effectively from the process influences in step S050.

The protective layer on the surfaces of the substrate between the fins can be etched firstly by the ALE or be etched by adding a breakthrough process before the main etching process.

If the protective layer is $SiO_2$, dry etching can be used to form the isolation structure trenches. The etching gas used for the subsequent main etching process is a combination of $HBr/He/O_2$, and the process conditions can be as follows: the flow rate of HBr is 180 sccm to 220 sccm, preferably 200 sccm; the flow rate of He is 350 sccm to 450 sccm, preferably 400 sccm; the flow rate of $O_2$ is 4 sccm to 6 sccm, preferably 5 sccm; the chamber pressure is 70 mtorr to 90 mtorr, preferably 80 mtorr; the source power range is 800 W to 1200 W, preferably 1000 W.

The etching selection ratio of $Si/SiO_2$ under the etching process conditions mentioned above can be up to 100, and the loss of the protective layer on the sidewalls of the fin structure will be less than 1 nm after anisotropic etching, so the fin structure will be protected effectively.

As another optional embodiment, if the protective layer is SiN, the thickness of the protective layer is 1 nm to 3 nm, and preferably 1.5 nm. After using dry etching to remove the protective layer on the surfaces of the substrate between the fins, the isolation structure trenches are formed by a wet etching process or a dry release process, such as by etching the substrate using alkaline solutions like potassium hydroxide (KOH) or tetramethylammonium hydroxide (TMAH), etc.

Due to a specific crystal orientation of the Si substrate, anisotropic etching of the Si substrate can be achieved, and the isolation structure with specific slope sidewalls can be formed. For the Si substrate having a crystal plane of (100), an isolation structure with a slope of 54.7° can be obtained by using the mask along the crystal direction <110>. The fin protection layer on the sidewalls of the fins can also protect the fin structure from being affected during the etching process and can be removed with the hard mask pattern (hard mask layer remaining) simultaneously by a wet etching. Adjustments of the materials and process steps mentioned in this embodiment provide another solution for realizing the corresponding process effects.

This process introduces advanced Atomic Layer Etching (ALE) technology and gives process examples to improve the etching depth and linewidth uniformity of the isolation pattern structure, so as to improve load effect.

After the isolation portion is etched, the protective layer on the sidewalls of the fins needs to be removed.

Before removing, exposed surfaces of the isolation structure trenches need to be modified to form a modified layer with a certain thickness on the exposed surfaces of the isolation structure trenches. Then, the protective layer and the modified layer are removed simultaneously. In this way, a problem of forming a horizontal step at interface between a lower part of a protective layer and a substrate due to the direct removal of a protective layer on the sidewalls of the fins in the prior art can be solved effectively, thereby avoiding undesired influence on the profile of the fins.

As a preferred embodiment, the modified layer (thermal oxidation layer) mentioned can be formed by thermally oxidizing the surfaces of the isolation structure trenches and consuming the silicon material on the surfaces of the isolation structure trenches by a certain thickness. Then, the protective layer and the thermal oxidation layer are removed simultaneously (synchronously) by wet etching, which not only eliminates the step formed in the previous etching step, but also removes an etching-damaged layer on the surface of the isolation structure trenches.

The process control of the thermal oxidation process mentioned focuses on the point that the consumed thickness of the silicon layer by thermal oxidation should be corresponded to the thickness of the protection layer on the sidewalls of the fins, so as to achieve a substantially consistent state at least.

Figure 6:
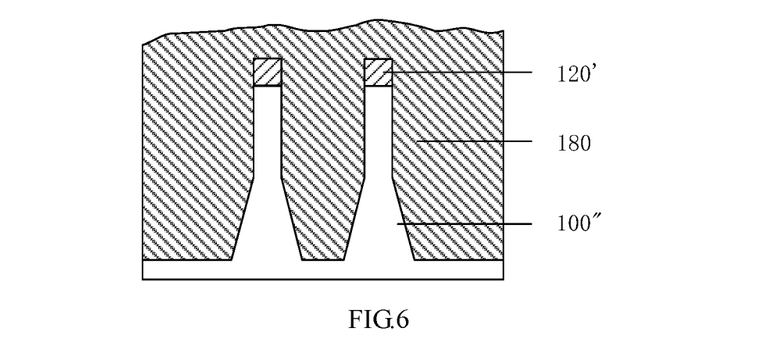
FIG. 6 is schematic structural diagrams of the semiconductor structure after respective process step 060 of the formation method of FIG. 1.

Step S060: filling a dielectric layer in the isolation structure trenches till to cover the fin structure.

Please refer to FIG. 6. This deposition process step requires that the dielectric layer 180 can fill the deep trenches of a large aspect ratio well without causing holes and other defects.

The dielectric layer 180 filled can be $SiO_2$ and formed by a suitable deposition process such as plasma enhanced chemical vapor deposition (PECVD), high density plasma chemical vapor deposition (HDPCVD), ALD, flowable chemical vapor deposition (FCVD) or a combination thereof. The top width of the trenches to be filled in this embodiment can be 10 nm, the total depth can be 92 nm, thus the value of the aspect ratio can exceed 9. General deposition processes are difficult to achieve this value of the aspect ratio; herein FCVD is preferred since the dielectric material is flowable with filling performance. After the subsequent annealing/curing steps, the dielectric layer formed can be converted to a solid state.

After this process step is completed, the dielectric layer fills the isolation structure trenches 170 and covers the top surface of the fin structure 155 (that is, the surface of the hard mask pattern 120'), and thickness of the dielectric layer located above the top of the fin structure is 10 nm to 20 nm, and preferably 15 nm.

Figure 7:
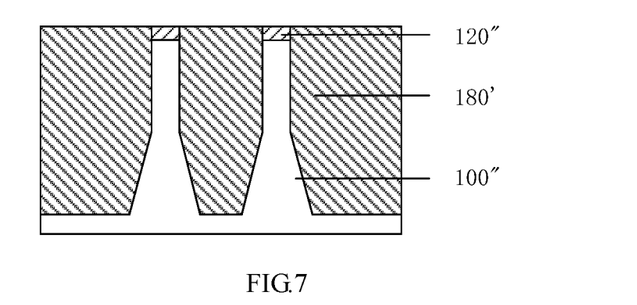
FIG. 7 is schematic structural diagrams of the semiconductor structure after respective process step 070 of the formation method of FIG. 1.

Step S070: planarizing the dielectric layer till to expose the hard mask layer on the top of the fin structure.

Please refer to FIG. 7. Due to an undulation of the surface of the dielectric layer, a planarization process such as chemical mechanical polishing (CMP) or film layer etch-back is required. In this embodiment, CMP is preferred, and the surface of the dielectric layer is grind and polished till to expose the hard mask layer on the top of the fins. After the planarization process, a remaining hard mask layer pattern 120" and a planarized filling dielectric layer 180' are formed.

In this embodiment, the loss of the hard mask layer can be controlled to 3 nm to 5 nm.

Figure 8:
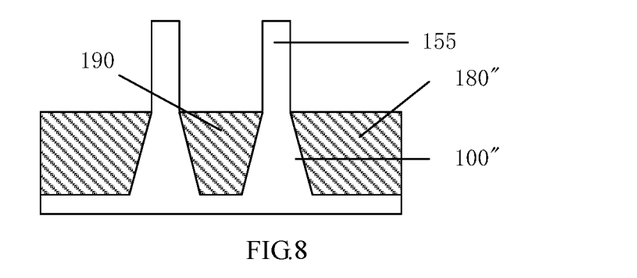
FIG. 8 is schematic structural diagrams of the semiconductor structure after respective process step 080 of the formation method of FIG. 1.

Step S080: performing a trench etching process to the dielectric layer and forming the fin structure and an isolation structure with sloped sidewalls.

Please refer to FIG. 8. By performing the trench etching process to the planarized filling dielectric layer 180', the fins are independent from each other, which leaves spaces for subsequent gate formation.

This process uses the remaining hard mask pattern 120" as a protective layer (protective mask) to etch the dielectric layer between the fins. Since the bulk silicon substrate does not have an obvious etch stop layer, the etching depth mainly depends on the etching time. For a device structure formed by the above processes, due to the profile differences between the fin structure and the isolation structure located below, subtle changes in spectrum can be detected during the etching process by a highly accurate endpoint detection method (exposed area for etching is gradually reduced), so that the etching process is terminated near an interface between the fin structure and the isolation structure, so as to control the etching depth.

Finally, the remaining hard mask layer can be removed by wet etching.

The fin structure 155 and the isolation structure 190 between the fins are formed. Wherein, the fin structure 155 is relatively steep and straight, the isolation structure 190 has a certain slope, and filling height of the remaining dielectric layer 180" and the height of the fins are controlled well. Meanwhile, the linewidths, heights, slopes and other morphological parameters of the fin structures are uniform.

In addition, in order to form an insulation isolation between the fins, it is necessary to form a doped PN junction at the bottom of the fins through a high-dose, high-angle ion implantation process to achieve electrical isolation, which is not described.

In summary, the formation method of the present invention utilizes advanced process control to adjust a process flow to form a fin structure and an isolation structure in steps, and adjusts the physical profiles of the sidewalls of both the fin structure and the isolation structure independently, so as to improve the process accuracy, uniformity and stability, and solve some difficulties of the existing technology, which can control the uniformity and consistency of the physical profiles of the fin structure and the isolation structure more accurately, improve the related electrical performances (such as switching current ratio $I_{on}/I_{off}$) of FET devices, and improve the device reliability and obtain higher product yields.

It will be appreciated that the disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. A formation method of a semiconductor structure, comprising the following steps in sequence:
    providing a semiconductor substrate, and forming a hard mask layer on the semiconductor substrate;
    forming a photo-lithographic pattern on the hard mask layer;
    using the photo-lithographic pattern as a mask and patterning the hard mask layer and the semiconductor substrate below the hard mask layer to obtain a hard mask pattern and a fin structure with a steep sidewall profile;
    forming a protective layer on a sidewall surface of the fin structure;
    using the fin structure as a mask to etch the semiconductor substrate located below to form isolation structure trenches;
    performing a modified treatment on exposed surfaces of the isolation structure trenches to form a modified layer; wherein a thickness of the modified layer and a thickness of the protective layer achieve a substantially consistent thickness;
    removing the protective layer and the modified layer simultaneously;
    filling a dielectric layer in the isolation structure trenches till to cover the fin structure;
    planarizing the dielectric layer till to expose the hard mask layer on the top of the fin structure;
    performing a trench etching process to the dielectric layer and forming the semiconductor structure having the fin structure and an isolation structure with sloped sidewalls.

2. The formation method of claim 1, wherein the modification treatment is a thermal oxidation process, a thickness of the exposed surfaces of the isolation structure trenches consumed by the thermal oxidation process corresponds to a thickness of the protective layer, and the protective layer and the modified layer are removed simultaneously by a wet etching process.

3. The formation method of claim 1, wherein the hard mask layer and the semiconductor substrate are patterned by an atomic layer etching process; wherein, during the atomic layer etching process, an etching amount of per cycle is 0.5 nm to 5 nm.

4. The formation method of claim 1, wherein the protective layer comprises SiO2 or SiN, or a combined layer of SiO2 and SiN.

5. The formation method of claim 1, wherein the protective layer is formed on the sidewall surface of the fin structure by a conformal deposition process.

6. The formation method of claim 5, wherein the conformal deposition process comprises ALD, PEALD or thermal oxidation deposition.

7. The formation method of claim 1, wherein the hard mask layer comprises one of SiN, SiON, SiC and SiO2, or a combined layer of at least two of SiN, SiON, SiC and SiO2.

8. The formation method of claim 1, wherein the protective layer is SiO2 and the semiconductor substrate is Si, the isolation structure trenches are formed by a dry etching process using etching gases comprising HBr, He and $O_2$, and flow rates of the etching gases are: HBr in a range of 180~ 220 sccm, He in a range of 350~ 450 sccm, $O_2$ in a range of 4~ 6 sccm; an etching pressure is 70~ 90 mtorr; a source power range is 800~ 1200 W.

9. The formation method of claim 1, wherein the protective layer is SiN and the semiconductor substrate is Si, the isolation structure trenches are formed by a wet etching process or a dry releasing process.

10. The formation method of claim 1, wherein during performing the trench etching process to the dielectric layer, the hard mask layer is used as a protective mask to etch the dielectric layer surrounding the fin structure, and by utilizing the profile differences between the fin structure with the steep sidewall profile and the isolation structure with sloped sidewalls, the etching depth can be controlled by an end point detection method.

\* \* \* \* \*